(12) United States Patent
Konno

(10) Patent No.: US 10,554,193 B2
(45) Date of Patent: Feb. 4, 2020

(54) ELASTIC WAVE DEVICE

(71) Applicant: Murata Manufacturing Co., Ltd., Nagaokakyo-shi, Kyoto-fu (JP)

(72) Inventor: Akira Konno, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/157,139

(22) Filed: Oct. 11, 2018

(65) Prior Publication Data

US 2019/0044495 A1 Feb. 7, 2019

Related U.S. Application Data

(63) Continuation of application No. PCT/JP2017/023045, filed on Jun. 22, 2017.

(30) Foreign Application Priority Data

Jun. 28, 2016 (JP) ................. 2016-127911

(51) Int. Cl.
*H03H 9/145* (2006.01)
*H03H 9/64* (2006.01)
*H03H 9/25* (2006.01)
*H03H 9/02* (2006.01)
(Continued)

(52) U.S. Cl.
CPC ........ *H03H 9/145* (2013.01); *H03H 9/02559* (2013.01); *H03H 9/02818* (2013.01); *H03H 9/02834* (2013.01); *H03H 9/02937* (2013.01); *H03H 9/25* (2013.01); *H03H 9/6436* (2013.01); *H03H 9/6489* (2013.01); *H01L 41/0477* (2013.01); *H01L 41/0533* (2013.01)

(58) Field of Classification Search
CPC .......... H03H 9/02559; H03H 9/02637; H03H 9/02818; H03H 9/02834; H03H 9/02937; H03H 9/145; H03H 9/25; H03H 9/6436; H03H 9/6489; H01L 41/0477; H01L 41/0533
USPC .................................................. 333/193–196
See application file for complete search history.

(56) References Cited

U.S. PATENT DOCUMENTS

2007/0096592 A1    5/2007  Kadota et al.
2014/0285287 A1    9/2014  Komatsu et al.
(Continued)

FOREIGN PATENT DOCUMENTS

JP    2010-166148 A    7/2010
JP    2014-187568 A    10/2014
(Continued)

OTHER PUBLICATIONS

Official Communication issued in International Patent Application No. PCT/JP2017/023045, dated Aug. 22, 2017.

*Primary Examiner* — Barbara Summons
(74) *Attorney, Agent, or Firm* — Keating & Bennett, LLP

(57) ABSTRACT

An elastic wave device includes an IDT electrode and an insulating film on a piezoelectric substrate. Above an intersection region of the IDT electrode, when one end in an elastic-wave propagation direction is a first end portion and the other end in the elastic-wave propagation direction is a second end portion, the thickness of the insulating film is decreased or increased towards a center in the elastic-wave propagation direction from the first end portion and the second end portion.

20 Claims, 11 Drawing Sheets

(51) Int. Cl.
*H01L 41/047* (2006.01)
*H01L 41/053* (2006.01)

(56) References Cited

U.S. PATENT DOCUMENTS

2015/0243873 A1* 8/2015 Nakanishi .......... H03H 9/02559
　　　　　　　　　　　　　　　　　　　　　310/313 B
2015/0333731 A1* 11/2015 Komatsu ............ H03H 9/02818
　　　　　　　　　　　　　　　　　　　　　310/313 D

FOREIGN PATENT DOCUMENTS

| WO | 2005/034347 A1 | 4/2005 |
| WO | 2011142183 A1 | 11/2011 |

* cited by examiner

ELASTIC WAVE DEVICE

CROSS REFERENCE TO RELATED APPLICATIONS

This application claims the benefit of priority to Japanese Patent Application No. 2016-127911 filed on Jun. 28, 2016 and is a Continuation Application of PCT Application No. PCT/JP2017/023045 filed on Jun. 22, 2017. The entire contents of each application are hereby incorporated herein by reference.

BACKGROUND OF THE INVENTION

1. Field of the Invention

The present invention relates to an elastic wave device in which an insulating film covers an IDT electrode.

2. Description of the Related Art

Various types of elastic wave devices that use a Rayleigh wave that propagates through an $LiNbO_3$ substrate have been proposed. In the elastic wave device described in WO2005/034347 below, an IDT electrode is provided on an $LiNbO_3$ substrate, and a silicon oxide film for temperature compensation is provided so as to cover the IDT electrode. In the elastic wave device described in WO2005/034347, the silicon oxide film is embedded between electrode fingers of the IDT electrode, and is provided so as to cover an upper surface of the IDT electrode. An upper surface of the silicon oxide film is flattened.

In the elastic wave device described in WO2005/034347, the elastic wave that is used is a Rayleigh wave, and a high order mode is excited. This high order mode sometimes occurred strongly in a frequency range of about 1.2 to 1.3 times the frequency of the Rayleigh wave. Therefore, the Rayleigh-wave high order mode is sometimes a problem as spuriousness. In addition, in a configuration in which an insulating film is provided so as to cover the IDT electrode, in addition to a Rayleigh wave, not only modes of elastic waves that are used, but also high order modes are excited and sometimes become a problem as spuriousness.

SUMMARY OF THE INVENTION

Preferred embodiments of the prevent invention provide elastic wave devices each capable of reducing spuriousness at high order modes of elastic waves, such as a Rayleigh wave.

An elastic wave device according to a preferred embodiment of the present invention includes an element substrate that includes a piezoelectric layer; an IDT electrode that is provided on the piezoelectric layer; and an insulating film that covers the IDT electrode. The IDT electrode includes an intersection region, which is a region where an elastic wave is excited. When an end in an elastic-wave propagation direction of the intersection region is a first end portion and another end in the elastic-wave propagation direction of the intersection region is a second end portion, above the intersection region of the IDT electrode, a thickness of the insulating film is decreased or increased towards a center in the elastic-wave propagation direction from the first end portion and the second end portion of the IDT electrode.

In a particular aspect of an elastic wave device according to a preferred embodiment of the present invention, the insulating film is a dielectric layer that directly covers the IDT electrode.

In another particular aspect of an elastic wave device according to a preferred embodiment of the present invention, the insulating film includes an inclined surface that is inclined with respect to an upper surface of the piezoelectric layer in the elastic-wave propagation direction.

In still another particular aspect of an elastic wave device according to a preferred embodiment of the present invention, at least above the intersection region of the IDT electrode, the thickness of the insulating film changes continuously along the elastic-wave propagation direction.

In still another particular aspect of an elastic wave device according to a preferred embodiment of the present invention, when one end of the intersection region in an intersecting width direction of the IDT electrode is a third end portion, and another end of the intersection region in the intersecting width direction of the IDT electrode is a fourth end portion, the thickness of the insulating film is decreased or increased towards a center in the intersecting width direction from the third end portion and the fourth end portion.

In still another particular aspect of an elastic wave device according to a preferred embodiment of the present invention, the piezoelectric layer is made of $LiNbO_3$.

In still another particular aspect of an elastic wave device according to a preferred embodiment of the present invention, a Rayleigh wave that propagates through the $LiNbO_3$ is used.

In still another particular aspect of an elastic wave device according to a preferred embodiment of the present invention, the elastic wave device is an elastic wave resonator including the IDT electrode.

In still another particular aspect of an elastic wave device according to a preferred embodiment of the present invention, the elastic wave device is a longitudinally coupled resonator elastic wave filter including a plurality of the IDT electrodes.

Elastic wave devices according to preferred embodiments of the present invention are capable of effectively reducing spuriousness caused by high order modes of elastic waves, such as a Rayleigh wave.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention are described below with reference to the drawings.

It is to be noted that each preferred embodiment described in the present description is an example, and partial replacement or combination of structures between different preferred embodiments may be made.

Figure 1:
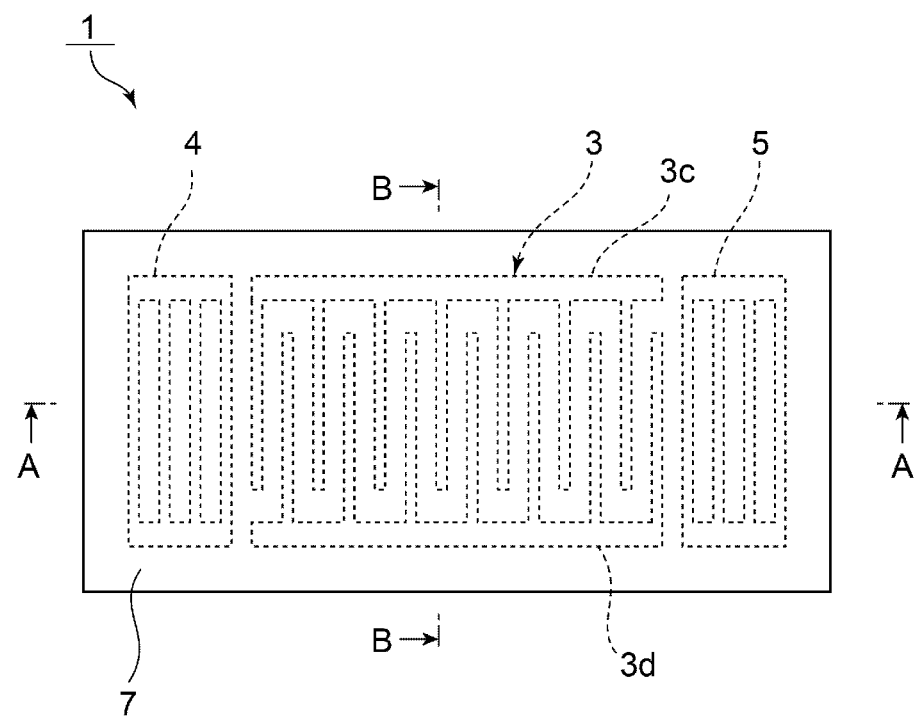
FIG. 1 is a plan view of an elastic wave device according to a first preferred embodiment of the present invention.
Figure 2:
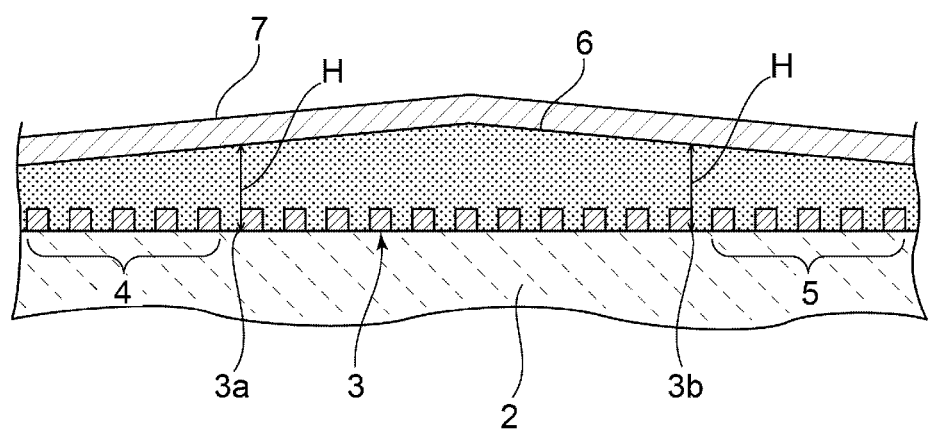
FIG. 2 is a front sectional view of the elastic wave device according to the first preferred embodiment of the present invention, and is a sectional view of a portion along line A-A in FIG. 1.

FIG. 1 is a plan view of an elastic wave device according to a first preferred embodiment of the present invention. FIG. 2 is a sectional view of a portion along line A-A in FIG. 1.

The elastic wave device 1 includes a piezoelectric substrate 2 as an element substrate. In the present preferred embodiment, the piezoelectric substrate 2 is an LiNbO$_3$ substrate having Euler angles (0°, 38.5°, 0°), for example. Indeed, other piezoelectric single crystals may be used.

In addition, although the piezoelectric substrate 2 is formed from a piezoelectric layer, the element substrate in various preferred embodiments of the present invention may be one in which a piezoelectric layer is laminated to, for example, a supporting member or an insulating film.

An IDT electrode 3 is provided on the piezoelectric substrate 2. Reflectors 4 and 5 are provided on two respective sides of the IDT electrode 3 in an elastic-wave propagation direction. This defines a one-port elastic wave resonator.

The IDT electrode 3 is a multilayer body including a plurality of metal films. That is, the IDT electrode 3 has a structure in which a Pt film and an Al film are laminated in this order from the side of the LiNbO$_3$ substrate.

The materials of the IDT electrode 3 and the reflectors 4 and 5 are not particularly limited to certain materials, and may be an appropriate metal, such as Au, Ag, Pt, W, Cu, Mo, or Al, or an alloy thereof. In addition, a thin close-contact layer or diffusion preventing layer may be laminated to an upper surface and a lower surface of the Pt film and the Al film. As the close-contact layer and the diffusion preventing layer, for example, a Ti film, an NiCr film, or a Cr film may be used.

An insulating film 6 preferably covers the IDT electrode 3 and the reflectors 4 and 5. The insulating film 6 is made of silicon oxide. In addition, a covering layer 7 preferably covers the insulating film 6. The covering layer 7 is made of silicon nitride.

The insulating film 6 may be made of other insulating materials, such as SiON, in addition to silicon oxide. The covering layer 7 may be made of materials other than silicon nitride.

Since the insulating film 6 is made of silicon oxide, in the elastic wave device 1, the absolute value of a frequency temperature coefficient TCF is able to be reduced. That is, the insulating film 6 made of silicon oxide exhibits a temperature compensation action. Indeed, an insulating film that does not have a temperature compensation function may also be used.

By forming the covering layer 7 out of silicon nitride, it is possible to increase moisture resistance.

At an intersection region of the IDT electrode 3, one end of the IDT electrode 3 in the elastic-wave propagation direction is a first end portion 3a and the other end of the IDT electrode 3 in the elastic-wave propagation direction is a second end portion 3b. It is to be noted that the intersection region is a region where electrode fingers having different potentials overlap each other in the elastic-wave propagation direction. An intersecting width direction is a direction of extension of the electrode fingers. A feature of the elastic wave device 1 is that, at a portion between the first end portion 3a and the second end portion 3b, the thickness of the insulating film 6 changes so as to increase towards the center of the IDT electrode 3 in the elastic-wave propagation direction. That is, the thickness of the insulating film 6 at the center of the IDT electrode 3 in the elastic-wave propagation direction is larger than thickness H of the insulating film 6 above the first end portion 3a and the second end portion 3b.

Figure 18:
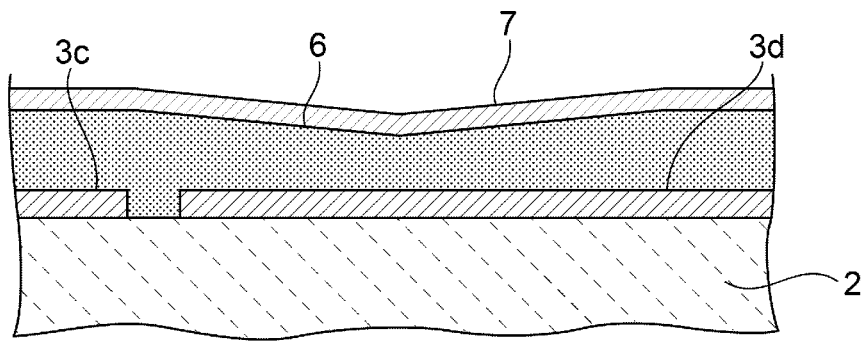
FIG. 18 is a sectional view of a portion along line B-B in FIG. 1.

On the other hand, one end in the intersecting width direction of the intersection region of the IDT electrode is a third end portion 3c, and the other end in the intersecting width direction of the intersection region of the IDT electrode is a fourth end portion 3d. It is to be noted that the intersecting width direction is a direction of extension of the electrode fingers. As shown in FIG. 18, in a section along line B-B in FIG. 1, in the present preferred embodiment, compared to thickness H of the insulating film 6 at the third end portion 3c and the fourth end portion 3d, the thickness of an insulating film portion between the third end portion 3c and the fourth end portion 3d is smaller towards the center in the intersecting width direction.

Figure 19:
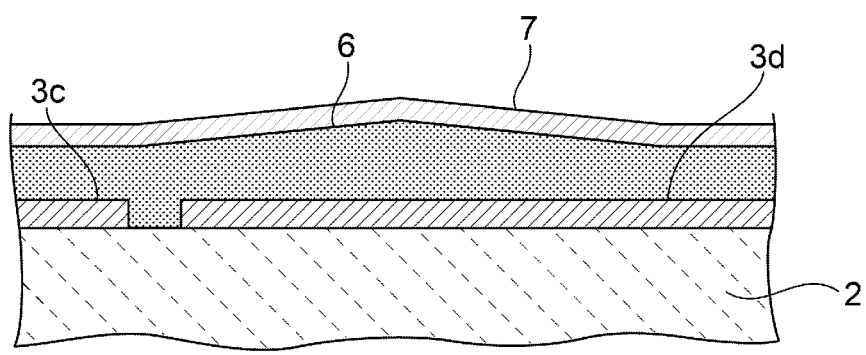
FIG. 19 is a sectional view of a modification of the portion along line B-B in FIG. 1.

It is to be noted that the thickness of the insulating film 6 need not change in the intersecting width direction. Indeed, it is desirable that, even in the intersecting width direction, the thickness of the insulating film 6 change. This makes it possible to further reduce spuriousness caused by high order modes. It is to be noted that, as shown in FIG. 19, in the section of a portion along the line B-B in FIG. 1 and in the intersecting width direction orthogonal to the elastic-wave propagation direction, the insulating film 6 may be thickest at the center of the IDT electrode 3 and become thinner towards outer sides in the intersecting width direction.

In the elastic wave device 1 of the present preferred embodiment, since the thickness of the insulating film 6 changes as described above, when a Raleigh wave is used, it is possible to suppress the influence of spuriousness caused by high order modes. This is explained with reference to FIGS. 3A and 3B, and FIG. 4.

In the elastic wave device 1 of the above-described preferred embodiment, the design parameters of the IDT electrode and the reflectors are as follows, for example:

Number of pairs of electrode fingers=100 pairs, and wavelength λ determined by electrode-finger pitch=about 5.0 μm.

Distance between the first end portion 3a and the second end portion 3b of the IDT electrode=about 500 μm.

Number of electrode fingers at the reflectors 4 and 5=20 electrode fingers each.

The multilayer structure of the IDT electrode 3 and the reflectors 4 and 5 is as shown in Table 1 below.

TABLE 1

| Material and Film Thickness of Each Layer of IDT Electrode | |
|---|---|
| Al | 206 nm |
| Pt | 108 nm |

Film thickness of a silicon nitride film as the covering layer 7 is about 50 nm.

The thickness H of the insulating film 6 at the first end portion 3a and the second end portion 3b=about 1680 nm.

In the present preferred embodiment, at the center in the elastic-wave propagation direction, the thickness H of the insulating film 6, which is the distance from the upper surface of the piezoelectric substrate 2 to the upper surface of the insulating film 6, is about 1850 nm, for example. In addition, the thickness of the insulating film 6 is changed so as to increase successively towards the center in the elastic-wave propagation direction from the first end portion 3a and the second end portion 3b.

Figure 3A:
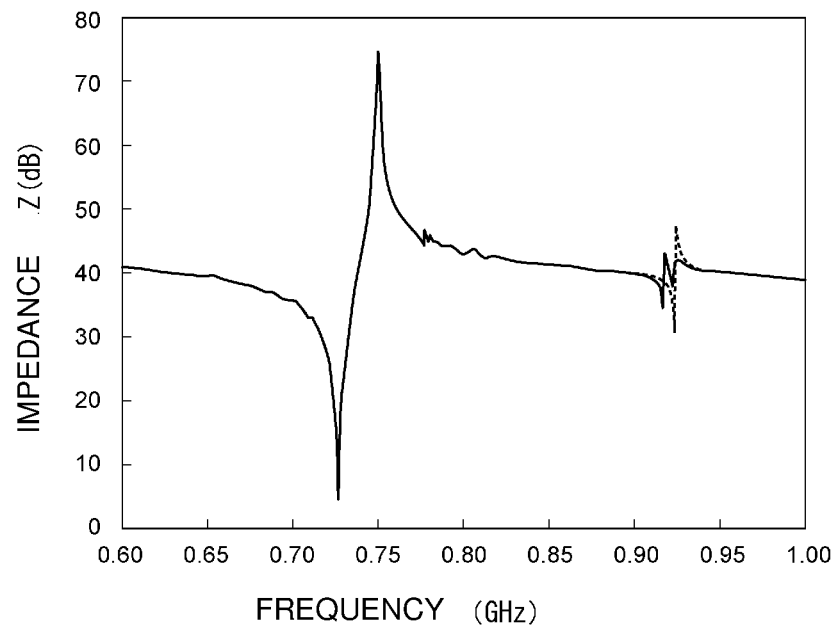
FIGS. 3A and 3B show, respectively, impedance-frequency characteristics of the elastic wave device of the first preferred embodiment of the present invention and an elastic wave device of a comparative example, and phase-frequency characteristics of the elastic wave device of the first preferred embodiment of the present invention and the elastic wave device of the comparative example.
Figure 3B:
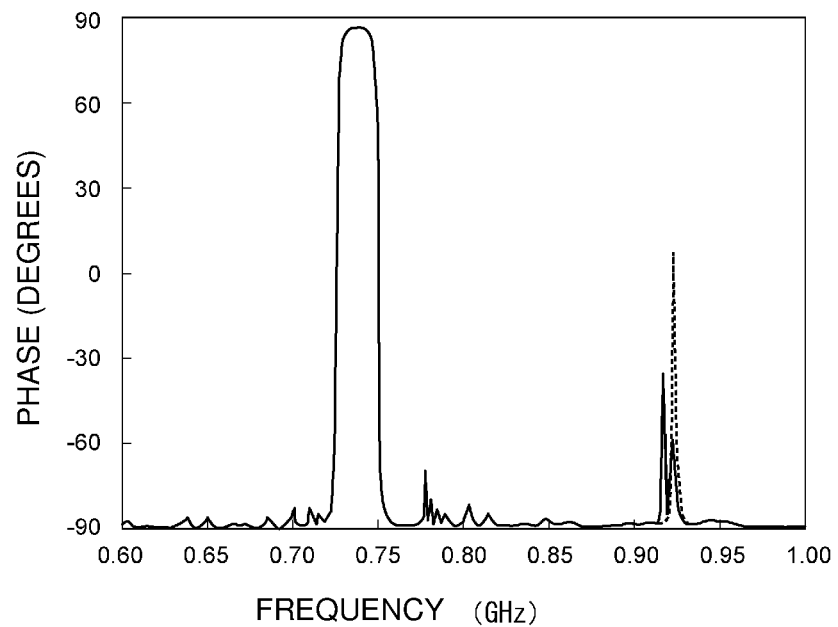
Figure 4:
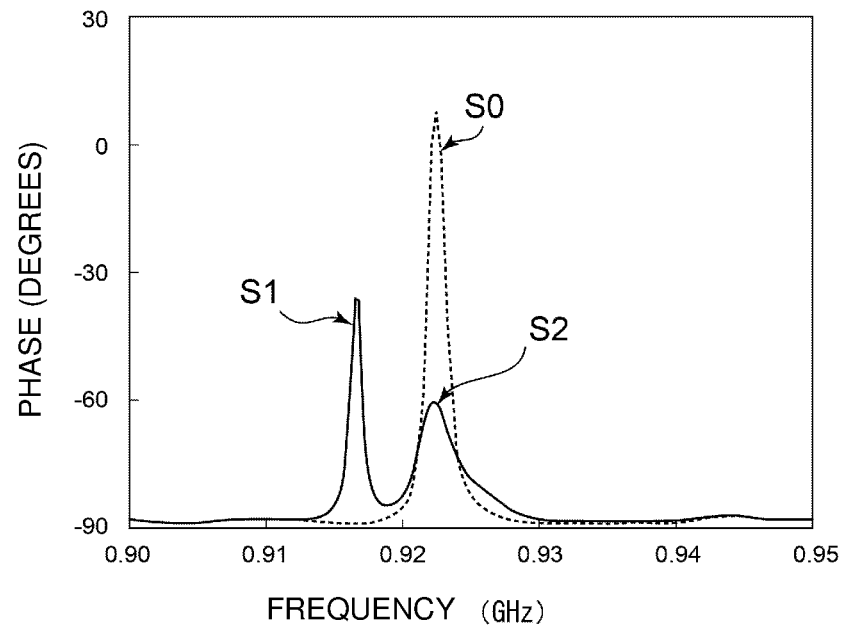
FIG. 4 is an enlarged view of a portion of the phase-frequency characteristics shown in FIG. 3B.

For comparison, an elastic wave device of a comparative example similar to that of the present preferred embodiment except that in place of the insulating film 6, an insulating film having a thickness of about 1750 nm and a flat upper surface is acquired. FIGS. 3A and 3B show, respectively, impedance-frequency characteristics of the elastic wave device of the present preferred embodiment and the elastic wave device of the comparative example, and phase-frequency characteristics of the elastic wave device of the present preferred embodiment and the elastic wave device of the comparative example. FIG. 4 is an enlarged view of a portion of the phase-frequency characteristics shown in FIG. 3B. The solid lines indicate the results of the present preferred embodiment, and the broken lines indicate the results of the comparative example. As is clear from FIGS. 3A, 3B, and 4, a response to a Rayleigh wave, which is a mode that is used, occurs near 0.73 GHz. The response to the Rayleigh wave is substantially the same in the results of the preferred embodiment and the comparative example. In contrast, near 0.92 GHz, spuriousness caused by high order modes occurs. In addition, as is clear from FIG. 4 showing in enlarged form a portion where the spuriousness of FIG. 3B occurs, the spuriousness caused by the high order modes is able to be made smaller in the present preferred embodiment than in the comparative example. This is because, since, in the insulating film 6, insulating film portions having difference thicknesses exist, the high order mode response is distributed. That is, as shown by arrows S1 and S2 in FIG. 4, in the present preferred embodiment, a plurality of responses at high order modes are acquired, whereas, in the comparative example, only a large response S0 occurs.

Therefore, the elastic wave device 1 is capable of effectively suppressing the influence of spuriousness caused by high order modes when a Rayleigh wave is used.

Figure 5:
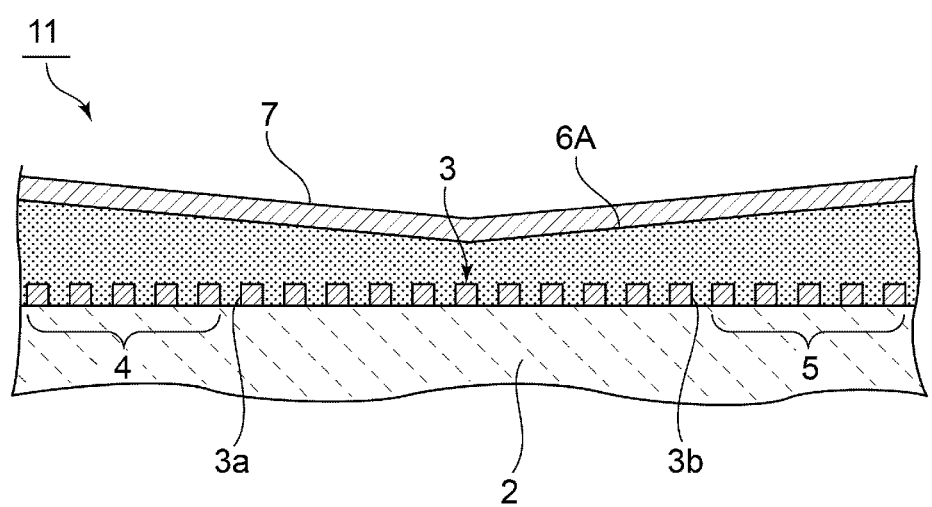
FIG. 5 is a front sectional view of an elastic wave device according to a second preferred embodiment of the present invention.

FIG. 5 is a front sectional view of an elastic wave device according to a second preferred embodiment of the present invention.

In the elastic wave device 11, an insulating film 6A preferably covers an IDT electrode 3. Here, in the elastic-wave propagation direction, the thickness of the insulating film is reduced towards the center in the elastic-wave propagation direction from a first end portion 3a and a second end portion 3b of the IDT electrode 3. The thickness H of the insulating film 6 at the first end portion 3a and the second end portion 3b preferably is equal to about 1820 nm, for example. The thickness of the insulating film 6A at the center in the elastic-wave propagation direction preferably is equal to about 1650 nm, for example. The design parameters of the IDT electrode and reflectors in the second preferred embodiment are preferably the same as those in the above-described first preferred embodiment.

Number of pairs of electrode fingers=100 pairs, and wavelength λ determined by electrode-finger pitch=about 5.0 μm.

Distance between the first end portion 3a and the second end portion 3b of the IDT electrode=about 500 μm.

Number of electrode fingers at the reflectors 4 and 5=20 electrode fingers each.

The multilayer structure of the IDT electrode 3 and the reflectors 4 and 5 is as shown in Table 2 below.

TABLE 2

| Material and Film Thickness of Each Layer of IDT Electrode | |
|---|---|
| Al | 206 nm |
| Pt | 108 nm |

Film thickness of a silicon nitride film as a covering layer 7 is about 50 nm.

Figure 6A:
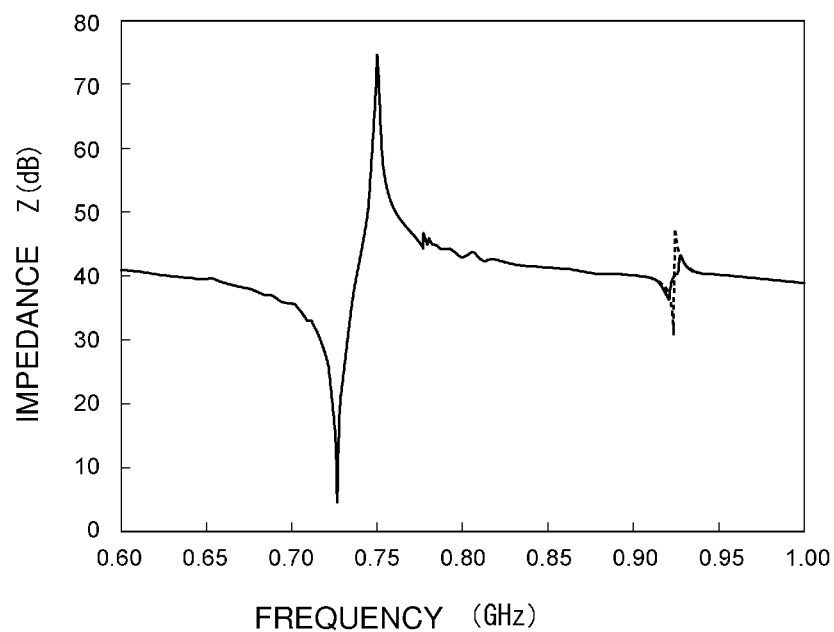
FIGS. 6A and 6B show, respectively, impedance-frequency characteristics of the elastic wave device of the second preferred embodiment and the elastic wave device of the comparative example, and phase-frequency characteristics of the elastic wave device of the second preferred embodiment and the elastic wave device of the comparative example.
Figure 6B:
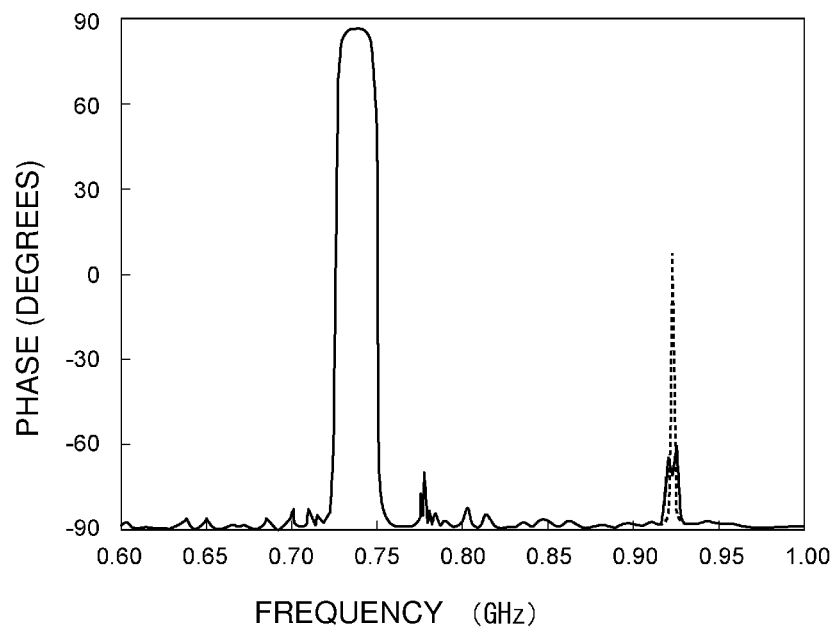
Figure 7:
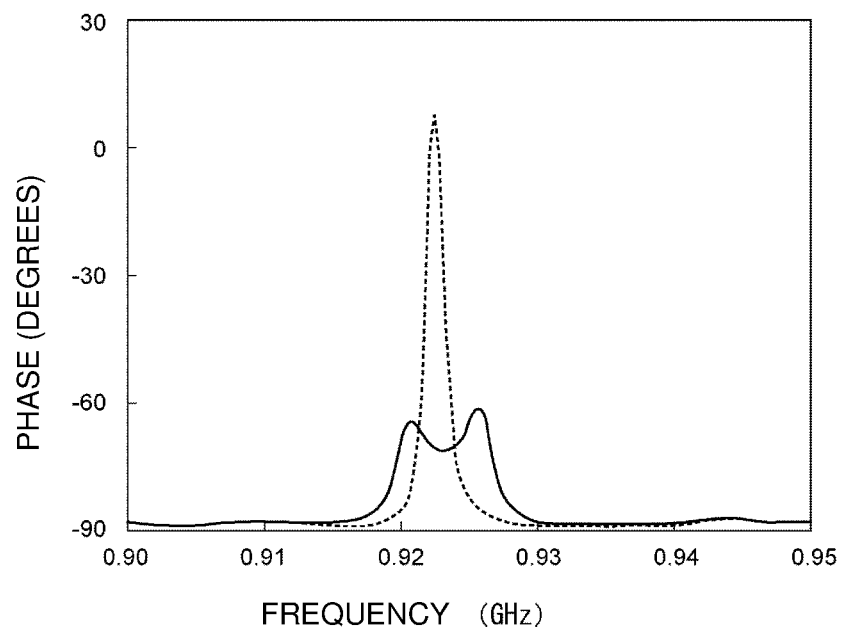
FIG. 7 is an enlarged view of a portion of FIG. 6B.

FIGS. 6A and 6B show, respectively, impedance-frequency characteristics and phase-frequency characteristics of the elastic wave device of the second preferred embodiment and the elastic wave device of the comparative example. FIG. 7 is an enlarged view of a portion of FIG. 6B. In FIGS. 6A, 6B, and 7, the solid lines indicate the results of the second preferred embodiment, and the broken lines indicate the results of the comparative example. The comparative example is the same as the comparative example shown in FIGS. 3A, 3B, and 4.

As is clear from FIGS. 6A, 6B, and 7, even in the second preferred embodiment, it is possible to distribute spuriousness caused by high order modes, so that it is possible to reduce the high order-mode spuriousness.

It is to be noted that, although, as shown in FIG. 5, in sectional view, the thickness of the insulating film 6A may change linearly in the elastic-wave propagation direction, the thickness may change curvedly. In addition, the thickness of the insulating film need not change continuously in the elastic-wave propagation direction.

It is to be noted that, although, in the above-described preferred embodiment, the case in which, when a Rayleigh wave is used, the influence of spuriousness caused by high order modes of the Rayleigh wave is able to be suppressed is described, spuriousness caused by high order modes may also become a problem when waves other than Rayleigh waves are used. That the same method is capable of suppressing spuriousness caused by high order modes of other waves is described by Experimental Examples 1 to 4 below. Experimental Examples 1 to 4 below are examples of preferred embodiments of the present invention, and are compared to Comparative Examples 1 to 4.

Experimental Example 1

As a piezoelectric substrate, an $LiNbO_3$ having Euler angles (0°, −5°, 0°) was used. As an IDT electrode 3, a multilayer metal film in which an Al film was laminated to a Pt film was used. The thickness of the Pt film was 120 nm, and the thickness of the Al film was 206 nm. Thickness H of a silicon oxide film, serving as an insulating film, at a first end portion 3a and a second end portion 3b of the IDT electrode 3 was 2130 nm. The thickness of the insulating film 6 at the center of the IDT electrode 3 in the elastic-wave propagation direction was 2450 nm.

The number of pairs of electrode fingers of the IDT electrode 3 was 100 pairs and the number of electrode fingers at each reflector was 20. The wavelength determined by the electrode-finger pitch of the IDT electrode 3 was 5 μm. The film thickness of a silicon nitride film, serving as a covering layer 7, was 50 nm.

The section of the insulating film 6 in Experimental Example 1 was the same as that in the first preferred embodiment shown in FIG. 2.

For comparison, an elastic wave device of Comparative Example 1 similar to that of Experimental Example 1 above except that an insulating film being a silicon oxide film had a thickness of 2250 nm and had a flat upper surface was acquired.

In Experimental Example 1 and Comparative Example 1, a Love wave is used as a main mode.

Figure 10:
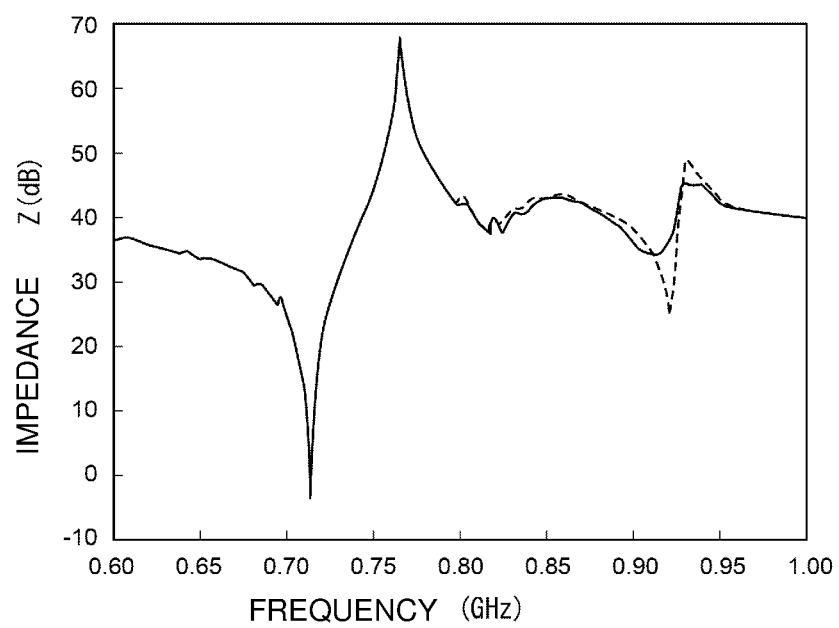
FIG. 10 shows impedance-frequency characteristics of an elastic wave device of Experimental Example 1 and an elastic wave device of Comparative Example 1.
Figure 11:
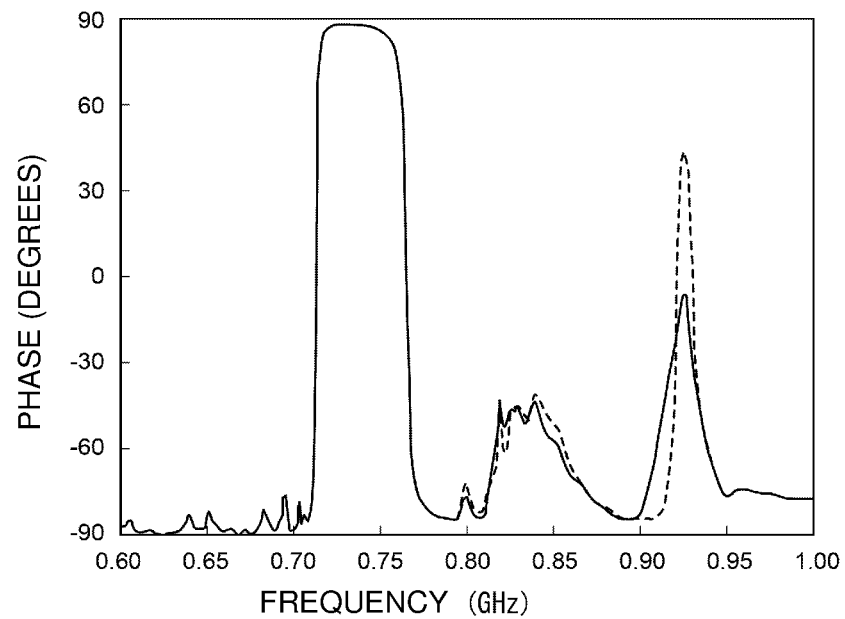
FIG. 11 shows phrase-frequency characteristics of the elastic wave device of Experimental Example 1 and the elastic wave device of Comparative Example 1.

FIGS. 10 and 11 show, respectively, the impedance characteristics of the elastic wave device of Experimental Example 1 above and the elastic wave device of Comparative Example 1, and the phase characteristics of the elastic wave device of Experimental Example 1 above and the elastic wave device of Comparative Example 1. In FIGS. 10 and 11, the solid lines indicate the results of Experimental Example 1, and the broken lines indicate the results of Comparative Example 1.

As is clear from FIGS. 10 and 11, for example, a high order mode that occurs near 0.91 to 0.94 GHz is suppressed according to Experimental Example 1 compared to Comparative Example 1.

Experimental Example 2

As a piezoelectric substrate, an $LiNbO_3$ substrate having Euler angles (0°, −5°, 0°) was used. As an IDT electrode 3, a multilayer metal film in which an Al film was laminated to a Pt film was used. The thickness of the Pt film was 120 nm, and the thickness of the Al film was 206 nm. The number of pairs of electrode fingers of the IDT electrode 3, the wavelength determined by the electrode-finger pitch, and the number of electrode fingers at reflectors 4 and 5 were the same as those in Experimental Example 1.

Thickness H of a silicon oxide film, serving as an insulating film 6, at a first end portion 3a and a second end portion 3b of the IDT electrode 3 was 2370 nm. In addition, the thickness of the insulating film 6 at the center of the IDT electrode 3 in the elastic-wave propagation direction was 2050 nm.

It is to be noted that the section of the insulating film 6 in Experimental Example 2 was the same as that in the second preferred embodiment shown in FIG. 5. The thickness of a covering layer 7, made of silicon nitride, was 50 nm.

For comparison, an elastic wave device of Comparative Example 2 similar to that of Experimental Example 2 above except that an insulating film being a silicon oxide film had a thickness of 2250 nm and had a flat upper surface was acquired.

In Experimental Example 2 and Comparative Example 2, a Love wave is used as a main mode.

Figure 12:
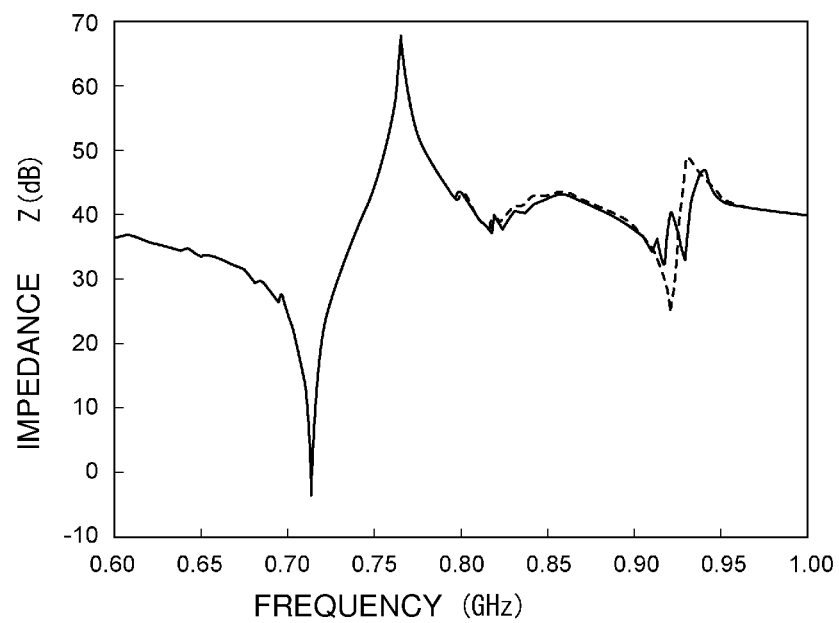
FIG. 12 shows impedance-frequency characteristics of an elastic wave device of Experimental Example 2 and an elastic wave device of Comparative Example 2.
Figure 13:
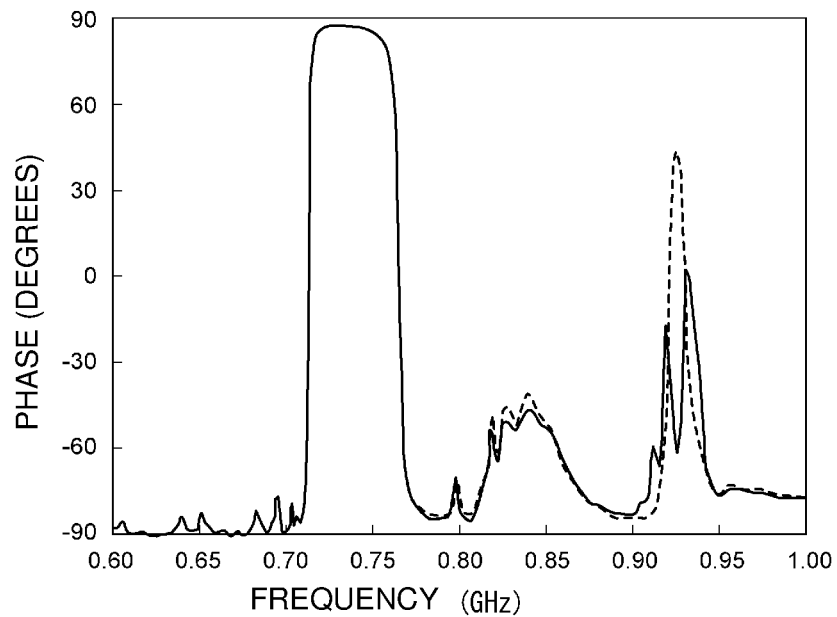
FIG. 13 shows phase-frequency characteristics of the elastic wave device of Experimental Example 2 and the elastic wave device of Comparative Example 2.

FIGS. 12 and 13 show, respectively, the impedance characteristics of the elastic wave device of Experimental Example 2 above and the elastic wave device of Comparative Example 2, and the phase characteristics of the elastic wave device of Experimental Example 2 above and the elastic wave device of Comparative Example 2. In FIGS. 12 and 13, the solid lines indicate the results of Experimental Example 2, and the broken lines indicate the results of Comparative Example 2.

As is clear from FIGS. 12 and 13, for example, a high order mode that occurs near 0.91 to 0.94 GHz is suppressed according to Experimental Example 2 compared to Comparative Example 2.

Experimental Example 3

As a piezoelectric substrate, an $LiTaO_3$ substrate having Euler angles (0°, 132°, 0°) was used. As an IDT electrode 3, a multilayer metal film in which an Al film was laminated to a Pt film was used. The thickness of the Pt film was 200 nm, and the thickness of the Al film was 206 nm. The number of pairs of electrode fingers of the IDT electrode 3, the wavelength determined by the electrode-finger pitch, and the number of electrode fingers at reflectors 4 and 5 were the same as those in Experimental Example 1.

In Experimental Example 3, the sectional structure of an insulating film 6 was the same as that in the first preferred embodiment shown in FIG. 2. Thickness H of a silicon oxide film, serving as the insulating film 6, at a first end portion 3a and a second end portion 3b of the IDT electrode 3 was 2880 nm. In addition, the thickness of the insulating film 6 at the center of the IDT electrode 3 in the elastic-wave propagation direction was 3200 nm. The thickness of a covering layer 7, made of a silicon nitride film, was 50 nm.

For comparison, an elastic wave device of Comparative Example 3 similar to that of Experimental Example 3 above except that an insulating film being a silicon oxide film had a thickness of 3000 nm and had a flat upper surface was acquired.

In Experimental Example 3 and Comparative Example 3, an SH wave is used as a main mode.

Figure 14:
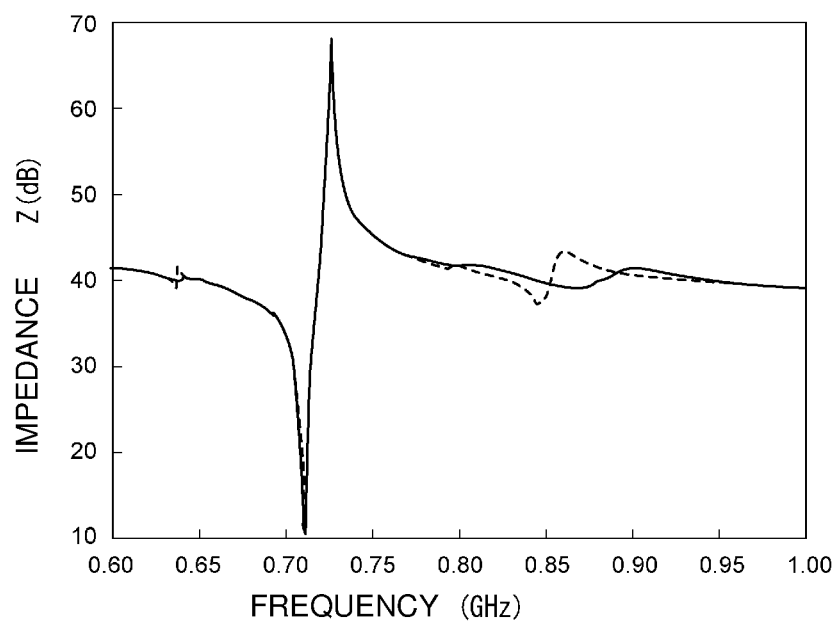
FIG. 14 shows impedance-frequency characteristics of an elastic wave device of Experimental Example 3 and an elastic wave device of Comparative Example 3.
Figure 15:
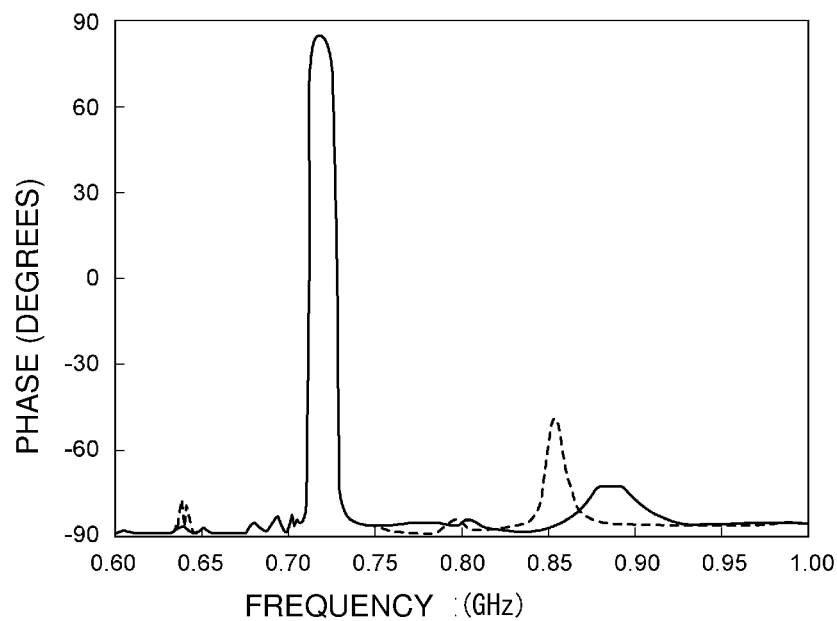
FIG. 15 shows phase-frequency characteristics of the elastic wave device of Experimental Example 3 and the elastic wave device of Comparative Example 3.

FIGS. 14 and 15 show, respectively, the impedance characteristics of the elastic wave device of Experimental Example 3 above and the elastic wave device of Comparative Example 3, and the phase characteristics of the elastic wave device of Experimental Example 3 above and the elastic wave device of Comparative Example 3. In FIGS. 14 and 15, the solid lines indicate the results of Experimental Example 3, and the broken lines indicate the results of Comparative Example 3.

As is clear from FIGS. 14 and 15, for example, a high order mode that occurs near 0.83 to 0.86 GHz is suppressed according to Experimental Example 3 compared to Comparative Example 3.

Experimental Example 4

As a piezoelectric substrate, an LiTaO$_3$ substrate having Euler angles (0°, 132°, 0°) was used. As an IDT electrode 3, a multilayer metal film in which an Al film was laminated to a Pt film was used. The thickness of the Pt film was 200 nm, and the thickness of the Al film was 206 nm. The number of pairs of electrode fingers of the IDT electrode 3, the wavelength determined by the electrode-finger pitch, and the number of electrode fingers at reflectors 4 and 5 were the same as those in Experimental Example 1.

In Experimental Example 4, the sectional structure of an insulating film 6 was the same as that in the second preferred embodiment. Thickness H of a silicon oxide film, serving as the insulating film 6, at a first end portion 3*a* and a second end portion 3*b* of the IDT electrode 3 was 3120 nm. In addition, the thickness of the insulating film 6 at the center of the IDT electrode 3 in the elastic-wave propagation direction was 2800 nm. The thickness of a covering layer 7, made of a silicon nitride film, was 50 nm.

For comparison, an elastic wave device of Comparative Example 4 similar to that of Experimental Example 4 above except that an insulating film being a silicon oxide film had a thickness of 3000 nm and had a flat upper surface was acquired.

In Experimental Example 4 and Comparative Example 4, an SH wave is used as a main mode.

Figure 16:
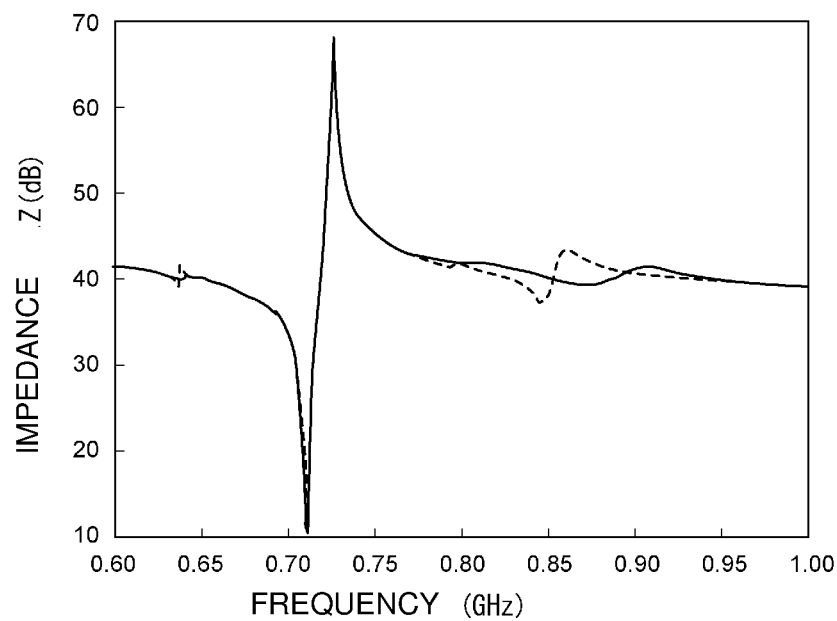
FIG. 16 shows impedance-frequency characteristics of an elastic wave device of Experimental Example 4 and an elastic wave device of Comparative Example 4.
Figure 17:
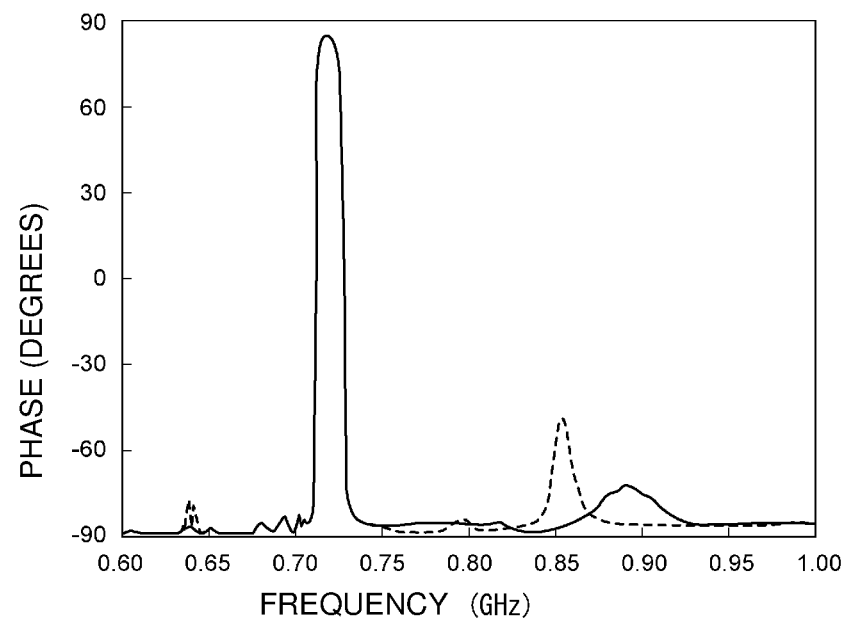
FIG. 17 shows phase-frequency characteristics of the elastic wave device of Experimental Example 4 and the elastic wave device of Comparative Example 4.

FIGS. 16 and 17 show, respectively, the impedance characteristics of the elastic wave device of Experimental Example 4 above and the elastic wave device of Comparative Example 4, and the phase characteristics of the elastic wave device of Experimental Example 4 above and the elastic wave device of Comparative Example 4. In FIGS. 16 and 17, the solid lines indicate the results of Experimental Example 4, and the broken lines indicate the results of Comparative Example 4.

As is clear from FIGS. 16 and 17, for example, a high order mode that occurs near 0.83 GHz to 0.86 GHz is suppressed according to Experimental Example 4 compared to Comparative Example 4.

Figure 8:
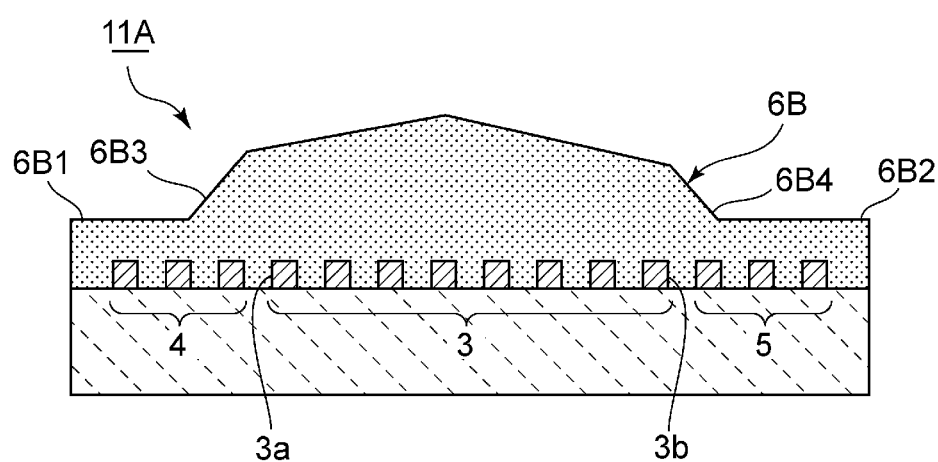
FIG. 8 is a front sectional view of an elastic wave device according to a third preferred embodiment of the present invention.

FIG. 8 is a front sectional view of an elastic wave device according to a third preferred embodiment of the present invention. In the elastic wave device 11A, the thickness of an insulating film 6B is increased towards the center in the elastic-wave propagation direction from a first end portion 3*a* and a second end portion 3*b* of an IDT electrode 3. Above a plurality of electrode fingers on an outer side of a reflector 4 and an outer side of a reflector 5, upper surface portions 6B1 and 6B2 of the insulating film 6B are not inclined and extend in a direction parallel to a principal surface of a piezoelectric substrate 2. In addition, inclined surfaces 6B3 and 6B4 where the thickness increases towards the first end portion 3*a* and the second end portion 3*b* from end portions of the corresponding upper surface portions 6B1 and 6B2 on the side of the IDT electrode 3 are provided. In this way, the inclined surfaces 6B3 and 6B4 and the flat upper surface portions 6B1 and 6B2 may be provided on outer sides of a portion where the IDT electrode 3 is provided in the elastic-wave propagation direction.

Figure 9:
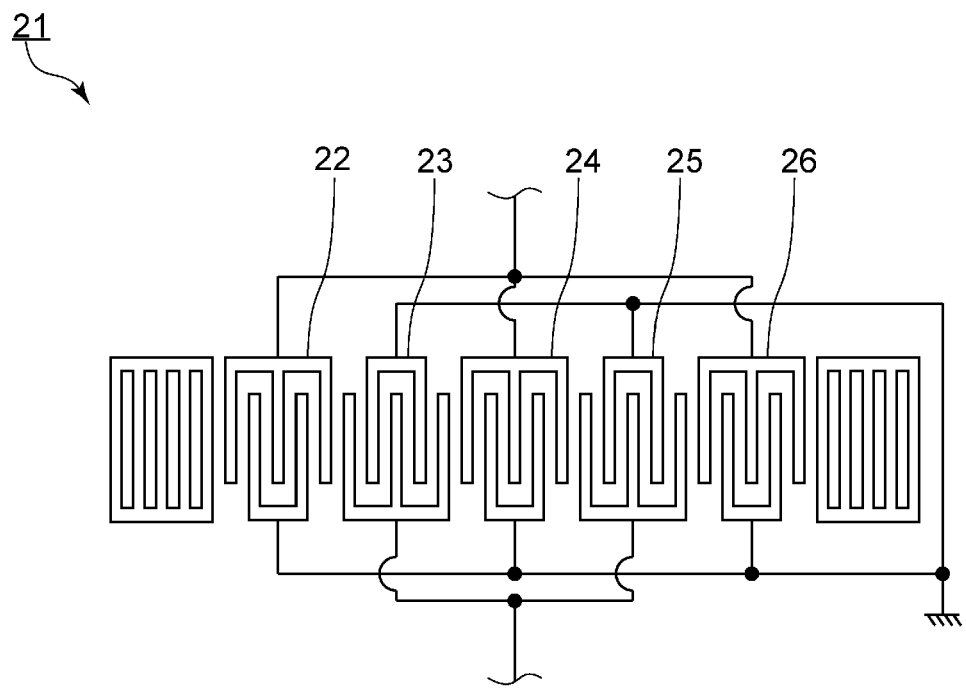
FIG. 9 is a plan view of a longitudinally coupled resonator elastic wave filter that is applicable to the present invention.

Although, in the first to third preferred embodiments, an elastic wave resonator is described, the present invention may be applied to a longitudinally coupled resonator elastic wave filter shown in FIG. 9. An elastic wave device 21, which is a longitudinally coupled resonator elastic wave filter, includes a plurality of IDT electrodes 22 to 26. In this case, a region where the plurality of IDT electrodes 22 to 26 are provided is defined as one region; and, in the one region, one end in the elastic-wave propagation direction is a first end portion and the other end in the elastic-wave propagation direction is a second end portion, and the thickness of an insulating film is changed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an element substrate that includes a piezoelectric layer;
   an IDT electrode that is provided on the piezoelectric layer; and
   an insulating film that covers the IDT electrode; wherein
   the IDT electrode includes an intersection region where an elastic wave is excited; and
   when an end in an elastic-wave propagation direction of the intersection region is a first end portion and another end in the elastic-wave propagation direction of the intersection region is a second end portion, above the intersection region of the IDT electrode, a thickness of the insulating film is decreased or increased towards a center in the elastic-wave propagation direction from the first end portion and the second end portion of the IDT electrode.

2. The elastic wave device according to claim 1, wherein the insulating film is a dielectric layer that directly covers the IDT electrode.

3. The elastic wave device according to claim 1, wherein the insulating film includes an inclined surface that is inclined with respect to an upper surface of the piezoelectric layer in the elastic-wave propagation direction.

4. The elastic wave device according to claim 1, wherein, at least above the intersection region of the IDT electrode, the thickness of the insulating film changes continuously along the elastic-wave propagation direction.

5. The elastic wave device according to claim 1, wherein, when one end of the intersection region in an intersecting width direction of the IDT electrode is a third end portion, and another end of the intersection region in the intersecting width direction of the IDT electrode is a fourth end portion, the thickness of the insulating film is decreased or increased towards a center in the intersecting width direction from the third end portion and the fourth end portion.

6. The elastic wave device according to claim 1, wherein the piezoelectric layer is made of LiNbO$_3$.

7. The elastic wave device according to claim 6, wherein a Rayleigh wave that propagates through the LiNbO$_3$ is used.

8. The elastic wave device according to claim 1, wherein the elastic wave device is an elastic wave resonator including the IDT electrode.

9. The elastic wave device according to claim 1, wherein the elastic wave device is a longitudinally coupled resonator elastic wave filter including a plurality of the IDT electrodes.

10. The elastic wave device according to claim 1, wherein the element substrate is a supporting member or an insulating film.

11. The elastic wave device according to claim 1, wherein reflectors are provided on two respective sides of the IDT electrode.

12. The elastic wave device according to claim 1, wherein the IDT electrode includes a plurality of metal films.

13. The elastic wave device according to claim 1, wherein the IDT electrode includes a Pt film and an Al film.

14. The elastic wave device according to claim 1, wherein the insulating film is made of silicon oxide or SiON.

15. The elastic wave device according to claim 1, further comprising a covering layer on the insulating film.

16. The elastic wave device according to claim 15, wherein covering layer is made of silicon nitride.

17. The elastic wave device according to claim 1, wherein the thickness of the insulating film is greatest at the center.

18. The elastic wave device according to claim 1, wherein the thickness of the insulating film at the center is 1850 nm.

19. The elastic wave device according to claim 1, wherein the thickness of the insulating film at the first end portion and at the second end portion is 1820 nm.

20. The elastic wave device according to claim 1, wherein the insulating film includes inclined surfaces where the thickness of the insulating film increases towards the first end portion and the second end portion from end portions of upper surface portions on a side of the IDT electrode.

* * * * *